United States Patent [19]
Segawa et al.

[11] Patent Number: 4,858,064
[45] Date of Patent: Aug. 15, 1989

[54] THICK-FILM HIGH FREQUENCY SIGNAL CIRCUIT APPARATUS WITH FEEDTHROUGH CAPACITOR

[75] Inventors: Masao Segawa; Masayuki Arakawa, both of Kanagawa, Japan

[73] Assignee: Kabushiki Kaisha Toshiba, Kawasaki, Japan

[21] Appl. No.: 251,747

[22] Filed: Oct. 3, 1988

[30] Foreign Application Priority Data

Oct. 29, 1987 [JP] Japan .................. 62-275202
Jan. 20, 1988 [JP] Japan .................. 63-11607

[51] Int. Cl.⁴ .......................... H01G 4/42; H03H 7/01
[52] U.S. Cl. ...................................... 361/302; 333/182
[58] Field of Search .................... 333/182; 334/1; 361/403, 302; 357/80

[56] References Cited
U.S. PATENT DOCUMENTS 4,493,007 1/1985 Sugitani ............................. 361/307
4,616,655 10/1986 Weinberg et al. .............. 361/401 X
4,675,629 6/1987 Sakamoto et al. .................. 333/182
4,784,618 11/1988 Sakamoto et al. ............. 333/182 X Primary Examiner—Donald A. Griffin
Attorney, Agent, or Firm—Oblon, Spivak, McClelland, Maier & Neustadt

[57] ABSTRACT

A thick-film high frequency signal circuit apparatus with a feedthrough capacitor. The apparatus includes a thick-film circuit in which a high frequency signal circuit is constituted on a substrate in a thick-film configuration, a shielding case for housing the thick-film circuit therein, a feedthrough capacitor constituted on one surface of the substrate in the thick-film configuration and a terminal for transmitting signals between the thick-film circuit and a circuit outside the shielding case, the terminal having a first end coupled to the thick-film circuit through the feedthrough capacitor and a second end protruding outside the shielding case through a hole defined therein.

24 Claims, 12 Drawing Sheets

THICK-FILM HIGH FREQUENCY SIGNAL CIRCUIT APPARATUS WITH FEEDTHROUGH CAPACITOR

FIELD OF THE INVENTION

The present invention relates generally to a thick-film high frequency signal circuit apparatus, and more particularly, to a thick-film high frequency signal circuit apparatus with an improved feedthrough capacitor suitable for a thick-film circuit.

BACKGROUND OF THE INVENTION

A thick-film high frequency signal circuit has been widely used for a tuner and a demodulator in radio receivers and/or television receivers. The thick-film high frequency signal circuit is housed in a shielding case in order to prevent an electromagnetic disturbance output from the circuit or input to the circuit. Generally, signal input terminals and/or signal output terminals for the thick-film high frequency signal circuit are provided on the shielding case via feedthrough capacitors. As is well known, the feedthrough capacitor operates to reduce noises entering into the circuit via terminals.

Referring now to FIGS. 1 and 2, a feedthrough capacitor 20 used in a conventional thick-film high frequency signal circuit apparatus will be described in brief. FIG. 1 shows a plan view and a sectional elevation of a dielectric body 21 for the feedthrough capacitor 20. FIG. 2 shows a manufacturing process of the feedthrough capacitor 20.

As shown in FIGS. 1(a) and 1(b), the dielectric body 21 made of ceramic is defined a through hole 22 at the center of the ceramic dielectric 21. A pair of electrodes 23 and 24 are attached on both sides of the ceramic dielectric 21 in orthogonal to the hole 22, as shown in FIG. 2(a). The electrodes 23 and 24 are defined holes with a diameter larger than the diameter of the through hole 22, respectively. A tin-coat conductive rod 25 is fit through the hole 21, as shown in FIG. 2(b). One end 25a of the conductive rod 25 is soldered to the electrode 23 with solder 26. Other end 25i b of the conductive rod 25 is extended through the electrode 24 without any conduction to the electrode 24. Thus, the feedthrough capacitor 20 is formed.

The feedthrough capacitor 20 is mounted on an outside wall of a shielding case 27 for housing a thick-film circuit 28, as shown in FIG. 3. FIG. 3 is a sectional elevation showing a conventional thick-film high frequency signal circuit apparatus 29.

In FIG. 3, the electrode 24 of the feedthrough capacitor 20 is soldered or bonded to the shielding case 27 by conductive bond 30, so that the conductive rod 25 penetrates both opposite walls of the shielding case 27 through holes 31 and 32 defined in the walls of the shielding case 27.

The conventional thick-film high frequency signal circuit apparatus 29, as shown in FIG. 3, comprises the feedthrough capacitor 20, the shielding case 27 and the thick-film circuit 28 housed inside the shielding case 27. The thick-film circuit 28 is constituted on a substrate 33. Some conductive layers 34a, 34b, 34c, . . . and some thick-film electrical components, e.g., a thick-film resistor 35 are formed on the substrate 33 by a conventional thick-film technique. The substrate 33 defines a through hole 36 at a position facing the feedthrough capacitor 20. Thus, the conductive rod 25 passes therethrough.

The middle part of the conductive rod 25 is soldered to one of the conductive layers, i.e., the conductive layer 34a around the hole 36 on the substrate 33 by solder 37. Thus, the conductive rod 25 of the feedthrough capacitor 20 is coupled to a signal line in the thick-film circuit 28 through the conductive layer 34a. Furthermore, the head of the other end 25b of the conductive rod 25 protrudes from the opposite wall of the shielding case 27. The protruding end of the conductive rod 25 constitutes a pin terminal 38 for receiving input signals to the thick-film high frequency signal circuit apparatus 29 or outputting signals therefrom.

The conventional thick-film high frequency signal circuit apparatus, as shown in FIG. 3, has some drawbacks as follows.

In the thick-film high frequency signal circuit apparatus 29, the feedthrough capacitor 20 is mounted outside the shielding case 27. Thus, the thick-film high frequency signal circuit apparatus 29 becomes large in size. Feedthrough capacitor 20 gives a poor appearance as it projects out of the shielding case 27. The feedthrough capacitor 20 also has an insufficient moisture-resistance due to the feedthrough capacitor 20 being mounted outside the shielding case 27.

A manufacturing process of the thick-film high frequency signal circuit apparatus 29 is very complicated. That is, the feedthrough capacitor 20 must be soldered to both the shielding case 27 and the conductive layer 24c of the thick-film circuit 28 after the thick-film circuit 28 is housed in the shielding case 27.

Further, an electromagnetic shielding of the thick-film high frequency signal circuit apparatus 29 is insufficient. Now the electromagnetic shielding of the conventional thick-film high frequency signal circuit apparatus 29 will be explained in reference to FIG. 4. FIG. 4 is an equivalent circuit diagram of the thick-film high frequency signal circuit apparatus 29, in which a plurality of the feedthrough capacitor 20 are provided for receiving signals therein or outputting signals therefrom.

As shown in FIG. 4, the feedthrough capacitor 20 is coupled to the opposite side of the pin terminal 38 in respect to the signal line, i.e., the conductive layer 34c. Such a circuit configuration is not desirable when viewed from a noise reducing object against noises, such as the electromagnetic disturbance, incoming or outgoing through the pin terminal 38.

SUMMARY OF THE INVENTION

It is, therefore, an object of the present invention to provide a thick-film high frequency signal circuit apparatus which is compact in size and has a good appearance.

Another object of the present invention to provide a thick-film high frequency signal circuit apparatus in which the feedthrough capacitor has a good moisture-resistance.

A further object of the present invention to provide a thick-film high frequency signal circuit apparatus which is easy to manufacture.

A still further object of the present invention to provide a thick-film high frequency signal circuit apparatus which has a sufficient noise reducing characteristics.

In order to achieve the above object, a thick-film high frequency signal circuit apparatus according to one aspect of the present invention which includes a thick-film circuit in which a high frequency signal circuit is constituted on a substrate in a thick-film configuration, a shielding case for housing the thick-film circuit therein, a feedthrough capacitor constituted on one surface of the substrate in the thick-film configuration and a terminal for transmitting signals between the thick-film circuit and a circuit outside the shielding case, the terminal having a first end coupled to the thick-film circuit through the feedthrough capacitor and a second end protruding outside the shielding case through a hole defined therein.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
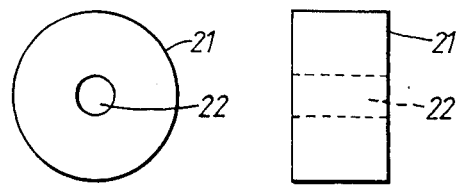
FIGS. 1(a) is a plan view showing a dielectric body of a feedthrough capacitor used in a conventional thick-film high frequency signal circuit apparatus.
FIG. 1(b) is a sectional elevation of the dielectric body of the FIG. 1(a)
Figure 2:
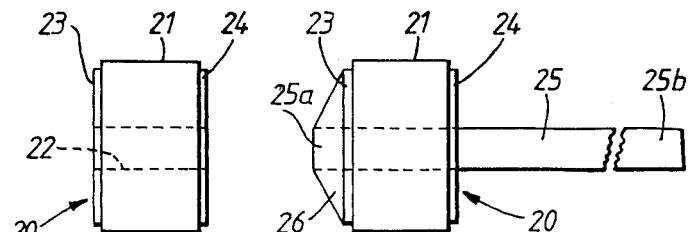
FIGS. 2(a) and 2(b) are diagrams showing processes for manufacturing a feedthrough capacitor used for a conventional thick-film high frequency signal circuit apparatus.

The present invention will be described in detail with reference to the FIGS. 5 through 18. Throughout the drawings, reference numerals or letters used in FIGS. 1, 2, 3 and 4 (Prior Arts) will be used to designate like or equivalent elements for simplicity of explanation.

Referring now to FIGS. 5, 6, 7 and 8, a first embodiment of the thick-film high frequency signal circuit apparatus with an improved feedthrough capacitor according to the present invention will be described in detail.

Figure 5:
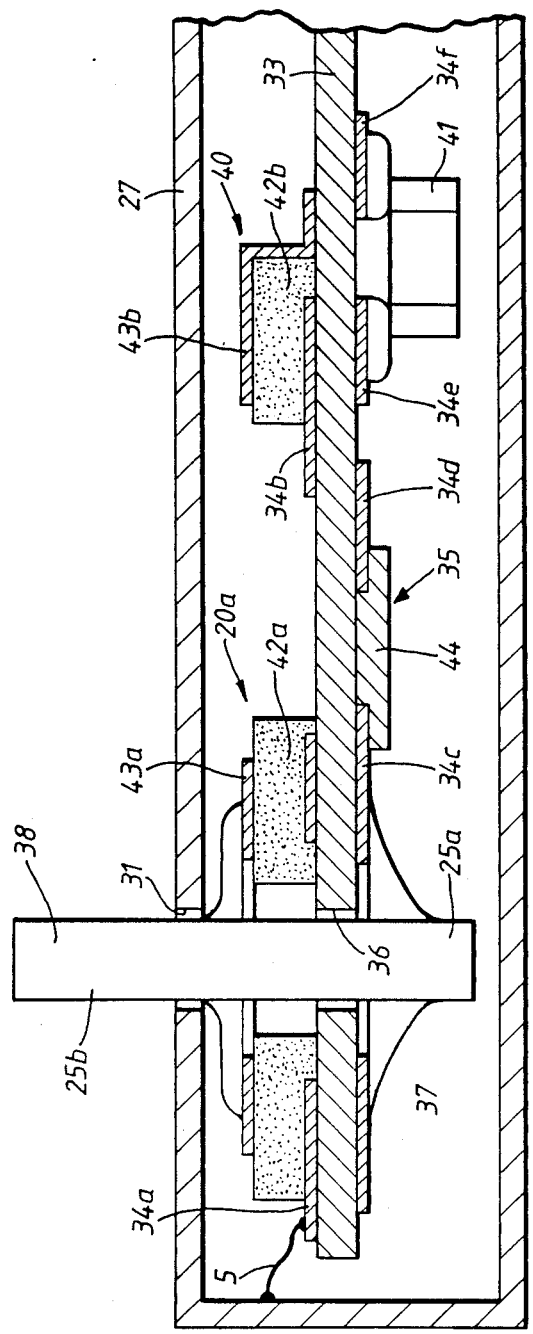
FIG. 5 is a sectional elevation showing a first embodiment of the thick-film high frequency signal circuit apparatus according to the present invention.

FIG. 5 is a sectional elevation of the embodiment of the thick-film high frequency signal circuit apparatus 29a with a feedthrough capacitor. In FIG. 5, the thick-film high frequency signal circuit apparatus 29a comprises a thick-film circuit 28a and a shielding case 27 for housing the thick-film, circuit 28a. The thick-film circuit 28a is constituted on a substrate 33 made of such as the alumina, etc. The thick-film circuit 28a comprises a feedthrough capacitor section 20a, a thick-film resistor 35, a regular thick-film capacitor section 40 and a chip transistor 41.

Referring now to FIG. 6, a manufacturing process of the thick-film circuit 28a will be described.

Figure 6A:
FIGS. 6(a) through 6(e) are diagrams showing processes for manufacturing the thick-film circuit of FIG. 5.
Figure 6B:
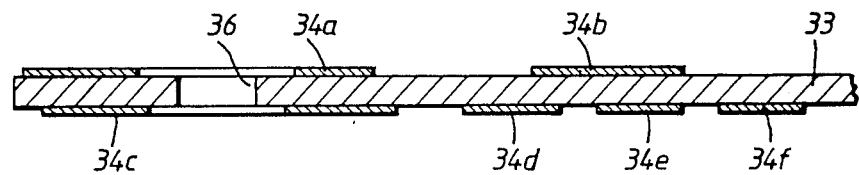

The substrate 33, as shown in FIG. 6(a), is made of ceramic, e.g., alumina. The substrate 33 defines a hole 36. For example, the hole 36 is cut through by a laser beam. Some conductive layers 34a, 34b, 34c, 34d, 34e, 34f, are coated on the substrate 33 according to a conventional screen printing, as shown in FIG. 6(b). The conductive layers 34a and 34c are shaped in a rectangular ring shape around the hole 36 at both surfaces of the substrate 33. The other conductive layers 34b, 34d, 34e and 34f are shaped to a rectangular shape. The conductive layers 34a, 34b, 34c, 34d, 34e, 34f are made of a silver or a palladium base conductive paste.

Figure 6C:
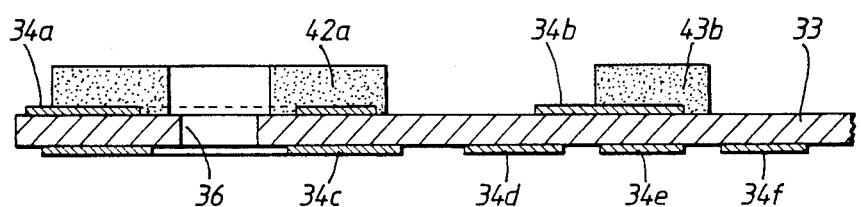

Then, dielectric layers 42a and 42b are coated on the conductive layers 34a and 34b according to the screen printing, as shown in FIG. 6(c). The dielectric layer 42a on the conductive layer 34a is formed in a rectangular ring shape in correspondence with shape of the conductive layer 34a. The dielectric layer 42b on the conductive layer 34b is formed in a rectangular shape in correspondence with the shape of the conductive layer 34b. The dielectric layers 42a and 42b are made of ceramic paste having a high permittivity.

Figure 6D:
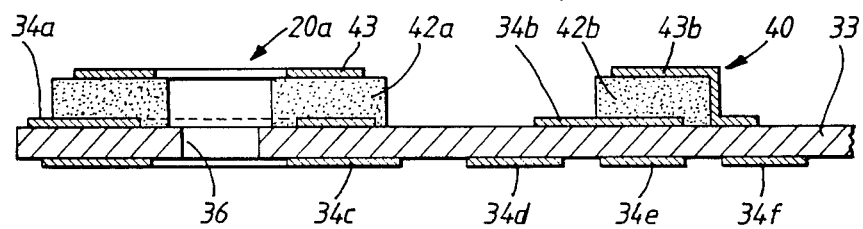

Then, conductive layers 43a and 43b are coated on the dielectric layers 42a and 42b according to the screen printing, as shown in FIG. 6(d). The conductive layers 43a and 43b are shaped in the rectangular ring shape around the hole 36 and the rectangular shape, in similar to the conductive layers 34a and 34b, respectively. A part of the conductive layer 43b elongates onto the substrate 33 along the dielectric layer 42b. The conductive layers 43a and 43b are also made of the silver or the palladium base conductive paste. The structure of FIG. 6(d) is fired at 900° C. for one hour so that the feedthrough capacitor section 20a and the regular thick-film capacitor 40 are formed on the substrate 33.

In the feedthrough capacitor section 20a, the conductive layer 34a constitutes a bottom electrode which will be electrically coupled to the shielding case 27. Thus, the conductive layer 34a will be referred as the bottom electrode 34a of the feedthrough capacitor section 20a. The conductive layer 43a constitutes a top electrode which will be electrically coupled to a pin terminal 38 for receiving input signals to the thick-film high frequency signal circuit apparatus 29a or outputting signals therefore for the shielding case 27. Thus, the conductive layer 43a will be referred as the top electrode 43a of the feedthrough capacitor section 20a.

In the regular thick-film capacitor section 40, the conductive layers 34b and 43b constitute bottom and top electrodes of the thick-film capacitor section 40. Thus, the conductive layers 34b and 43b will be referred as the bottom and top electrodes 34b and 43b of the thick-film capacitor section 40, in similar to the feedthrough capacitor section 20a.

Figure 6E:
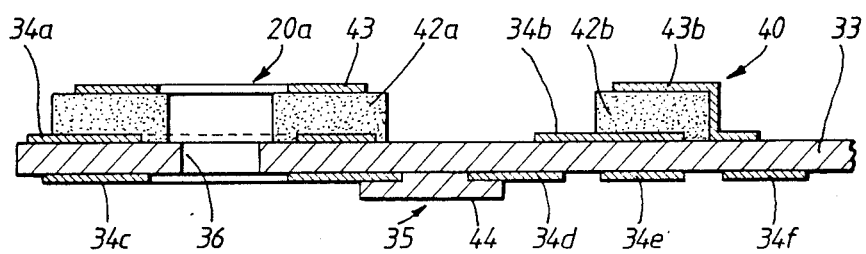

Then, a resistive layer 44 is coated on the substrate 33, as shown in FIG. 6(e). Both ends of the resistive layer 44 are overlapped on ends of the conductive layers 34c and 34d. The resistive layer 44 is made of ruthenium oxide base resistive paste. Then, the structure of FIG. 6(e) is fired at 850° C. for one hour so that the thick-film resistor 35 is formed on the substrate 33. The conductive layers 34e and 34f are used for electrical contact with the chip transistor 41, as shown in FIG. 5.

Figure 7:
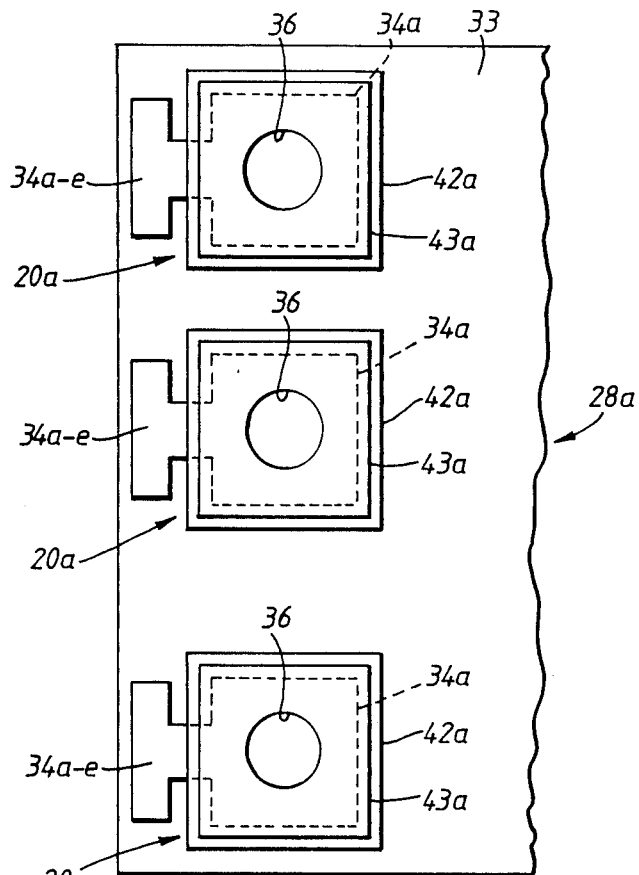
FIG. 7 is a plan view showing a part of the thick-film circuit of FIG. 5.

Referring now to FIG. 7, a plan view of a part of the thick-film circuit 28a will be described. In FIG. 7, the thick-film circuit 28a includes three feedthrough capacitor sections 20a. Each of the feedthrough capacitor sections 20a is formed to the rectangular ring shape, as described above. However, the feedthrough capacitor sections 20a can be formed in the round ring shape. Each of the feedthrough capacitor sections 20a comprises the bottom electrode 34a, the dielectric layer 42a and the top electrode 43a. A part of the bottom electrode 34a is elongated from the rectangular ring portion so that the elongated portion 34a–e can be used for electrical coupling to some other circuit.

Each of the feedthrough capacitor sections 20a is formed to a size in that the dielectric layer made of the above-mentioned ceramic paste has an area of 3.52 mm². As a result, these feedthrough capacitor sections 20a have had a capacitance as large as 4000 pF to 4500 pF. The capacitance of the feedthrough capacitor section 20a is realized by such a small area less than half of that of the conventional feedthrough capacitor 20 of FIGS. 2 and 3.

The thick-film high frequency signal circuit apparatus 29a is provided with a tin-coat conductive rod 25, as shown in FIG. 5. The conductive rod 25 fits through the hole 42 of the substrate 33 before housing the structure of FIG. 6(e) into the shielding case 29. One end 25a of the conductive rod 25 is soldered to both the conductive layers 34a and 34c by solder 37. Another end 25b of the conductive rod 25 protrudes the outside of the shielding case 27 through a hole 31 defined in the wall of the shielding case 27. Thus, the end 25a of the conductive rod 25 constitutes a pin terminal 38 for receiving input signals into the thick-film high frequency signal circuit apparatus 29a or outputting signals therefrom. The elongated portion 34a–e of the bottom electrode 34a is coupled to the shielding case 27 through a conductive wire 45.

Figure 8:
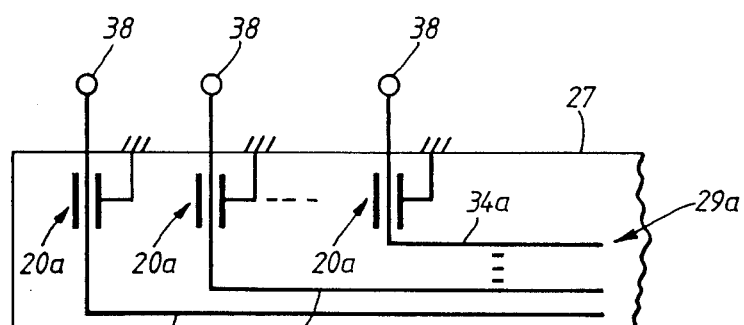
FIG. 8 is an equivalent circuit diagram of the thick-film high frequency signal circuit apparatus of FIG. 5.

Referring now to FIG. 8, an equivalent circuit diagram of the thick-film high frequency signal circuit apparatus 29a will be described. In FIG. 8, the thick-film high frequency signal circuit apparatus 29a includes three feedthrough capacitor sections 20a, in similar to the thick-film circuit 28a of FIG. 7. These three feedthrough capacitor sections 20a are provided for receiving signals into the thick-film high frequency signal circuit apparatus 29a or outputting signals therefrom through the pin terminals 38.

Figure 4:
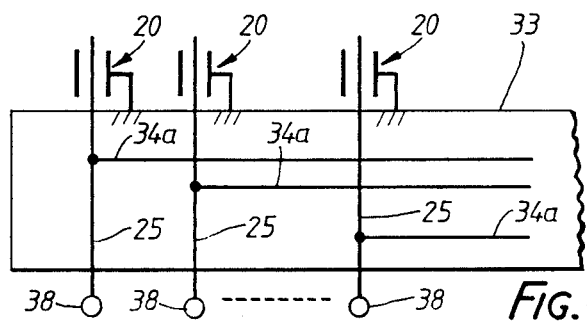
FIG. 4 is an equivalent circuit diagram of the thick-film high frequency signal circuit apparatus of FIG. 3.

As shown in FIG. 8, the feedthrough capacitor sections 20a are positioned between the pin terminals 38 and signal lines 46 which are constituted by the conductive layers 34c or coupled to thereto (see FIG. 5). Thus, the feedthrough capacitor sections 20a are desirable in comparison to the conventional feedthrough capacitor 20, as shown in FIG. 4, when viewed from the noise reducing object against noises, such as the electromagnetic disturbance incoming or outgoing through the pin terminals 38.

The thick-film high frequency signal circuit apparatus 29a has the feedthrough capacitor sections 20a in the shielding case 27. Thus, the thick-film high frequency signal circuit apparatus 29a becomes compact in size and gives a good appearance since the feedthrough capacitor sections 20a is contained in the shielding case 27.

Furthermore, the feedthrough capacitor sections 20a are formed simultaneously in the manufacturing process of the regular thick-film capacitor 40. Thus the thick-film high frequency signal circuit apparatus 29a can be easily realized without spending any extra costs and processes for the feedthrough capacitor sections 20a.

Figure 9:
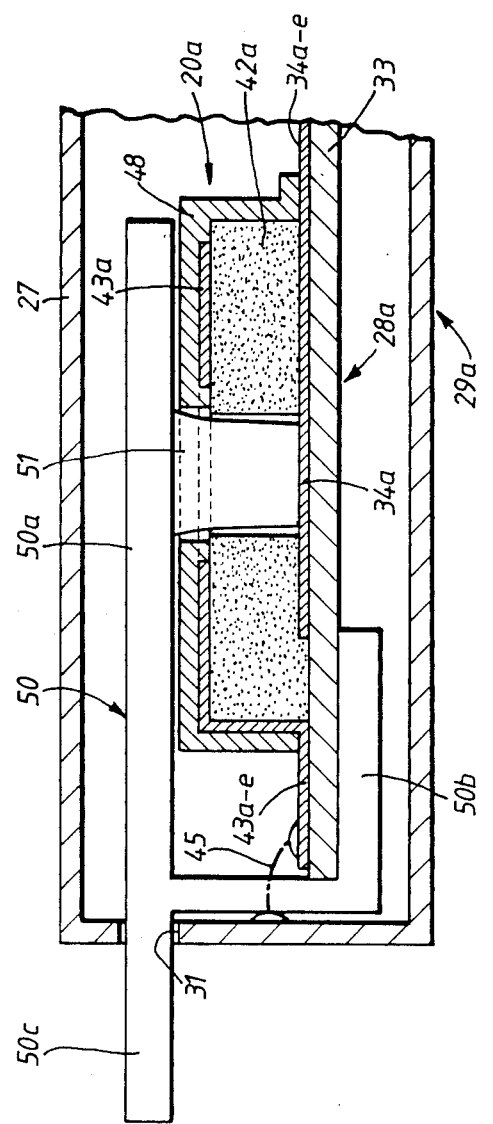
FIG. 9 is a sectional elevation showing a second embodiment of the thick-film high frequency signal circuit apparatus according to the present invention.
Figure 10:
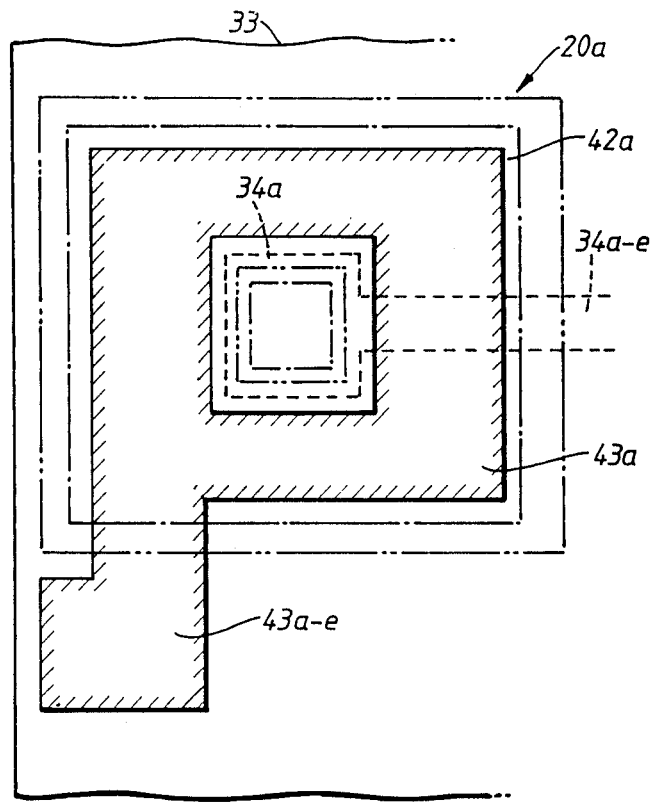
FIG. 10 is a plan view showing a part of the thick-film signal circuit of FIG. 9.
Figure 11:
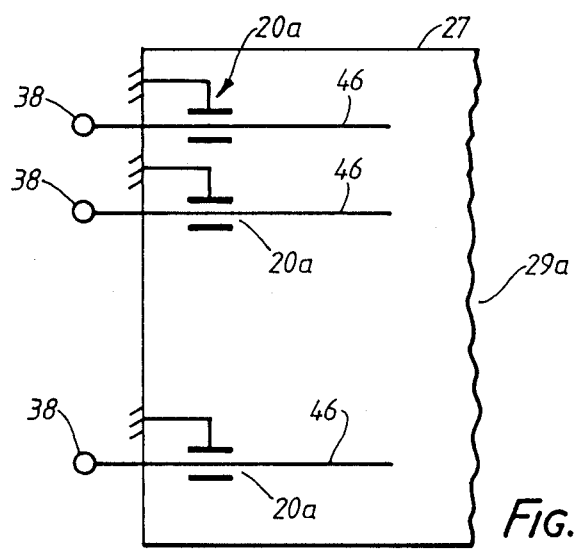
FIG. 11 is an equivalent circuit diagram of the thick-film high frequency signal circuit apparatus of FIG. 9.

Referring now to FIGS. 9, 10 and 11, a second embodiment of the thick-film high frequency signal circuit apparatus with an improved feedthrough capacitor according to the present invention will be described in detail. In FIGS. 9, 10 and 11, reference numerals or letters used in FIGS. 5, 6, 7 and 8 (first embodiment) will be used to designate like or equivalent elements for simplicity of explanation.

FIG. 9 is a sectional elevation of the embodiment of the thick-film high frequency signal circuit apparatus 29a with a feedthrough capacitor. The thick-film high frequency signal circuit apparatus 29a comprises a thick-film circuit 28a and a shielding case 27 for housing the thick-film circuit 28a. In FIG. 9, a part corresponding to a feedthrough capacitor section 20a is shown in respect to the thick-film circuit 28a. However, the thick-film circuit 28a can be provided with other thick-film components such as the feedthrough capacitor section 20a, the thick-film resistor 35, the regular thick-film capacitor section 40 and the chip transistor 41 in the first embodiment.

The thick-film circuit 28a is constituted on a substrate 33 made of such as the alumina, etc., in similar to the first embodiment. A conductive layer 34a is coated on the substrate 33 according to the conventional screen printing. The conductive layer 34a is shaped in a rectangular shape. The conductive layer 34a is made of the silver or the palladium base conductive paste, in similar to the first embodiment.

Then, a dielectric layer 42a is coated on the conductive layer 34a according to the screen printing. The dielectric layer 42a is formed in the rectangular ring shape so that the dielectric layer 42a defines a rectangular hole 47 in correspondence with the conductive layer 34a. The hole 47 exposes the conductive layer 34a. The dielectric layer 42a is made of ceramic paste, in similar to the first embodiment.

Then, a conductive layer 43a is coated on the dielectric layer 42a according to the screen printing. The conductive layer 43a is also made of the silver or the palladium base conductive paste. The conductive layer 43a is also shaped in the rectangular ring shape in correspondence with the dielectric layer 42a. A part of the conductive layer 43a elongates to the substrate 33 along the dielectric layer 42a. The elongated potion 43a-e of the conductive layer 43a cam be used for electrical coupling to some other circuit. The above-mentioned structure constituted on the substrate 33 is fired at 900° C. for one hour so that the feedthrough capacitor section 20a is formed on the substrate 33 simultaneously with the manufacturing process of some other regular thick-film capacitor section such as the regular thick-film capacitor section 40 of the first embodiment.

In the feedthrough capacitor section 20a, the conductive layer 34a constitutes a bottom electrode which will be electrically coupled to the shielding case 27. Thus, the conductive layer 34a will be referred as the bottom electrode 34a of the feedthrough capacitor section 20a, in similar to the first embodiment. The conductive layer 43a constitutes a top electrode which will be electrically coupled to a pin terminal 38 for receiving input signals to the thick-film high frequency signal circuit apparatus 29a or outputting signals therefrom for the shielding case 27. Thus, the conductive layer 43a will be also referred as the top electrode 43a of the feedthrough capacitor section 20a.

Then, an insulative cover 48 is coated on the feedthrough capacitor section 20a. The insulative cover 48 is formed in the rectangular cylinder shape so that the insulative cover 48 covers the feedthrough capacitor section 20a. The insulative cover 48 defines a borehole 49 in correspondence with the hole 47 of the dielectric layer 42a.

Referring now to FIG. 10, a plan view of a part of the thick-film circuit 28a will be described. In FIG. 10, the feedthrough capacitor sections 20a is formed to the rectangular ring shape, as described above. However, the feedthrough capacitor sections 20a can be formed in the round ring shape. The feedthrough capacitor sections 20a comprises the bottom electrode 34a, the dielectric layer 42a, the top electrode 43a and the insulative cover 48. The bottom electrode 34a and the top electrode 43a are provided with the elongated portions 34a-e and 43a-e for use of electrical couplings to some other circuits.

The thick-film high frequency signal circuit apparatus 29a is provided with a tin-coat lead 50, as shown in FIG. 9. The lead 50 is mounted to the thick-film circuit 28a before housing the thick-film circuit 28a in the shielding case 27. One end of the lead 50 forks into two branches 50a and 50b. The branches 50a and 50b fit to the feedthrough capacitor sections 20a so that the lead 50 is mounted to the thick-film circuit 28a. One branch 50a of the lead 50 is coupled to the bottom electrode 34a through conductive paste 51 filled in the hole 47 of the dielectric layer 42a and the borehole 49 of the insulative cover 48. The other branch 50b of the lead 50 is attached to a rear surface of the substrate 33. Another end 50c of the lead 50 protrudes the outside of the shielding case 27 through a hole 31 defined in the sidewall of the shielding case 27. Thus, the end 50c of the lead 50 constitutes a pin terminal 38 for receiving input signals into the thick-film high frequency signal circuit apparatus 29a or outputting signals therefrom. The elongated portion 34a-e of the bottom electrode 34a is coupled to the shielding case 27 through a conductive wire 45.

Referring now to FIG. 11, an equivalent circuit diagram of the thick-film high frequency signal circuit apparatus 29a will be described. In FIG. 11, a plurality of the feedthrough capacitor sections 20a are provided for receiving signals into the thick-film high frequency signal circuit apparatus 29a or outputting signals therefrom. As shown in FIG. 11, each of the feedthrough capacitor sections 20a are positioned between the pin terminals 38 and signal lines 46 which are constituted by the conductive layers 34c or coupled thereto (see FIG. 9). Thus, the feedthrough capacitor sections 20a are desirable in comparison to the conventional feedthrough capacitor 20, as shown in FIG. 4, when viewed from the noise reducing object against noises, such as the electromagnetic disturbance incoming or outgoing through the pin terminals 38.

Figure 12:
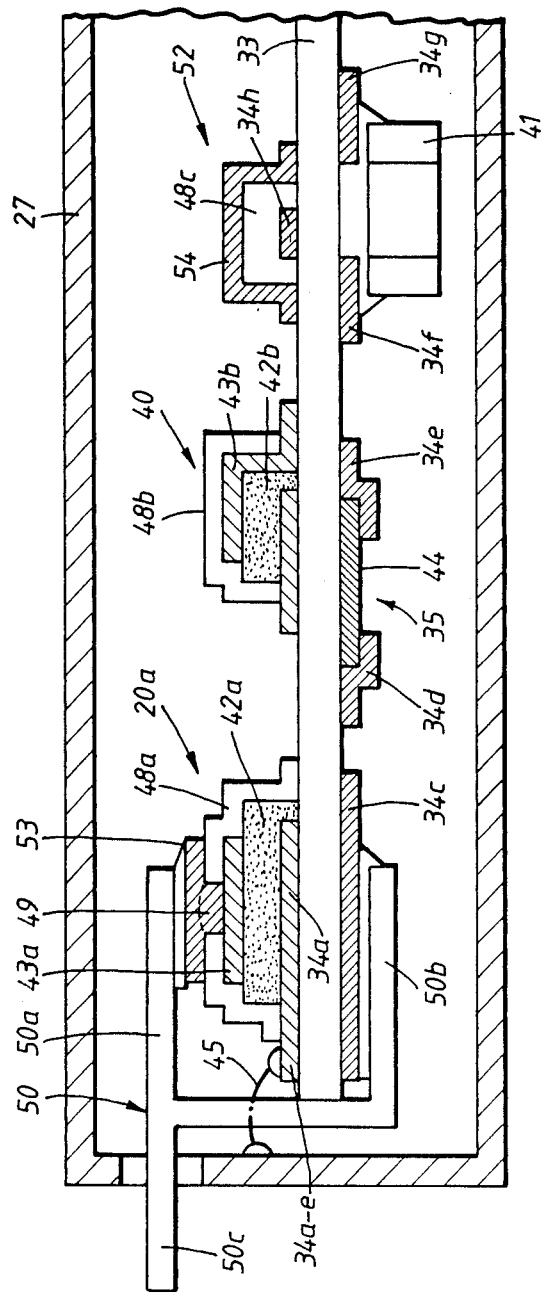
FIG. 12 is a sectional elevation showing a third embodiment of the thick-film high frequency signal circuit apparatus according to the present invention.

Referring now to FIGS. 12 and 13, a third embodiment of the thick-film high frequency signal circuit apparatus with an improved feedthrough capacitor according to the present invention will be described in detail.

FIG. 12 is a sectional elevation of the embodiment of the thick-film high frequency signal circuit apparatus 29a with a feedthrough capacitor section. In FIG. 12, the thick-film high frequency signal circuit apparatus 29a comprises a thick-film circuit 28a and a shielding case 27 for housing the thick-film circuit 28a. The thick film circuit 28a is constituted on a substrate 33 made of such as the alumina, etc. The thick-film circuit 28a comprises a feedthrough capacitor section 20a, a thick-film resistor 35, a regular thick-film capacitor section 40, a chip transistor 41 and a jumper wiring section 52.

Referring now to FIG. 13, a manufacturing process of the thick-film circuit 28a will be described.

Figure 13A:
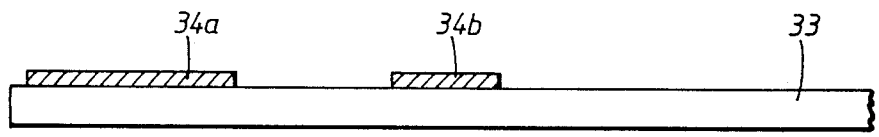
FIGS. 13(a) through 13(g) are diagrams showing processes for manufacturing the thick-film circuit of FIG. 12.
Figure 13B:
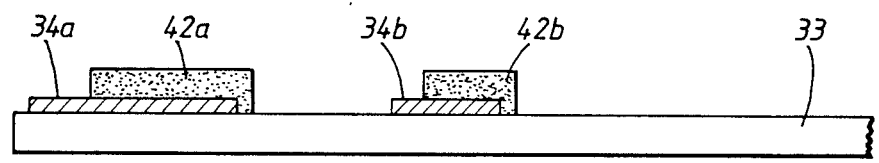

The substrate 33 is made of ceramic, e.g., alumina Two conductive layers 34a and 34b are coated on the substrate 33 according to a conventional screen printing, as shown in FIG. 13(b). The conductive layers 34a and 34b are made of the silver or the palladium base conductive paste, in similar to the first embodiment.

Dielectric layers 42a and 42b are coated on the conductive layers 34a and 34b according to the screen printing, as shown in FIG. 13(b). The dielectric layers 42a and 42b almost cover the conductive layers 34a and 34b, respectively. But, a part of each of the conductive layers 34a and 34b elongates outside the dielectric layers 42a and 42b along the substrate 33. The dielectric layers 42a and 42b are made of ceramic paste having a high permittivity.

Figure 13C:
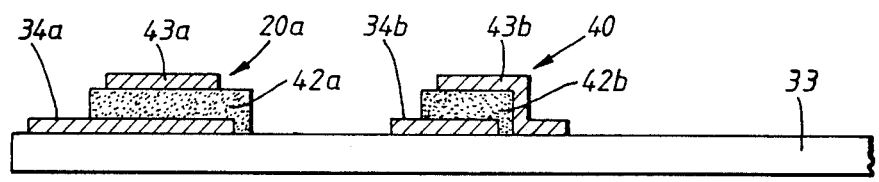

Conductive layers 43a and 43b are coated on the dielectric layers 42a and 42b according to the screen printing, as shown in FIG. 13(c). A part of the conductive layer 43b elongates onto the substrate 33 along the side of the dielectric layer 42b. The conductive layers 43a and 43b are also made of the silver or the palladium base conductive paste. The structure of FIG. 13(c) is fired at 900° C. for one hour so that the feedthrough capacitor section 20a and the regular thick-film capacitor 40 are formed on the substrate 33.

In the feedthrough capacitor section 20a, the conductive layer 34a constitutes a bottom electrode which will be electrically coupled to the shielding case 27. Thus, the conductive layer 34a will be referred as the bottom electrode 34a of the feedthrough capacitor section 20a. The conductive layer 43a constitutes a top electrode which will be electrically coupled to a pin terminal 38 for receiving input signals to the thick-film high frequency signal circuit apparatus 29a or outputting signals therefrom for the shielding case 27. Thus, the conductive layer 43a will be referred as the top electrode 43a of the feedthrough capacitor section 20a.

In the regular thick-film capacitor section 40, the conductive layers 34b and 43b constitute bottom and top electrodes of the thick-film capacitor section 40. Thus, the conductive layers 34b and 43b will be referred as the bottom and top electrodes 34b and 43b of the thick-film capacitor section 40, in similar to the feedthrough capacitor section 20a.

Figure 13D:
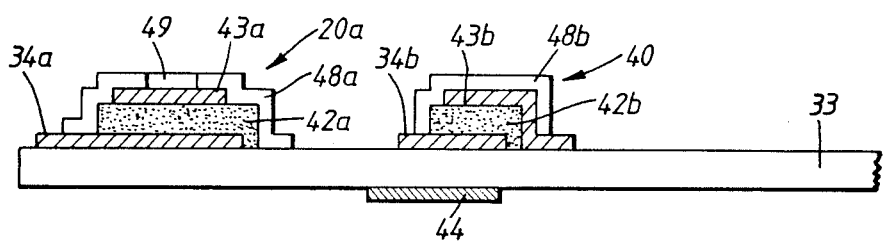

Insulative covers 48a and 48b are coated to cover the feedthrough capacitor section 20a and the regular thick-film capacitor 40, as shown in FIG. 13(d). The insulative cover 48a defines a borehole 49 so that the top electrode 43a exposes through the borehole 49.

Then, a resistive layer 44 is coated on the substrate 33, as shown in FIG. 13(d). The resistive layer 44 is made of ruthenium oxide base resistive paste. Then, the structure of FIG. 13(d) is fired at 850° C. for one hour so that the thick-film resistor 35 is formed on the substrate 33.

Figure 13E:
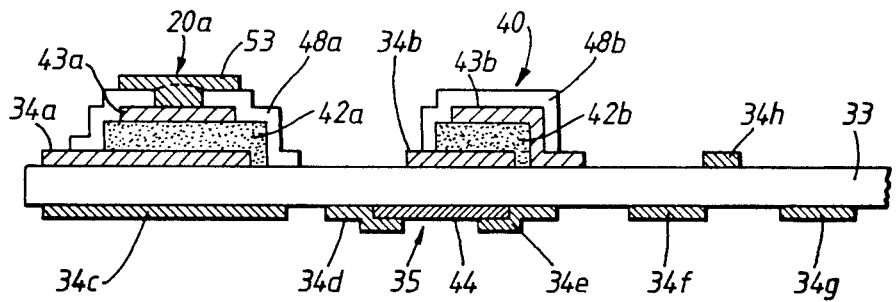

A conductive layer 53 is coated on the insulative cover 48a of the feedthrough capacitor section 20a, as shown in FIG. 13(e). A part of the conductive layer 53 fills in the borehole 49 of the insulative cover 48a so that the conductive layer 53 is coupled to the top electrode 43a of the feedthrough capacitor section 20a. Simultaneously to the forming of the conductive layer 53, some other conductive layers 34c to 34h are coated on the substrate 33. A part of each of the conductive layers 34d and 34e are overlapped to ends of the thick-film resistor 35. The conductive layers 34f and 34g will be used for an electrical contact with the chip transistor 41, as shown in FIG. 12.

Figure 13F:
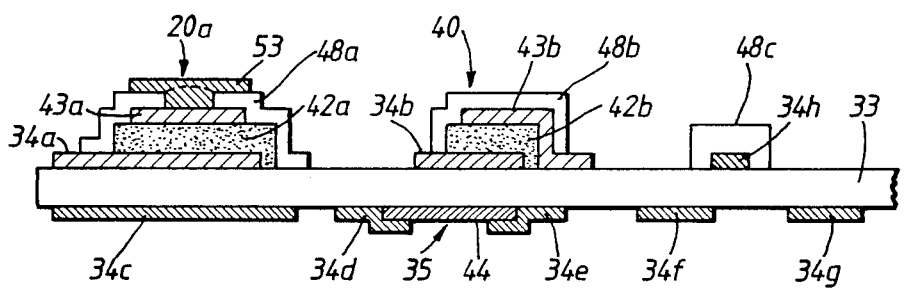
Figure 13G:
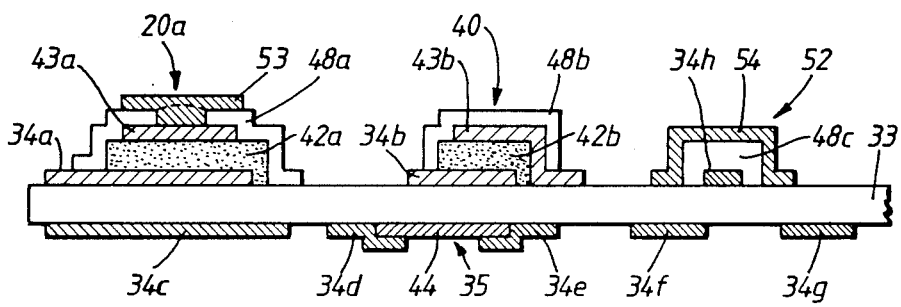

An insulative covers 48c is coated to cover the conductive layer 34h, as shown in FIG. 13(f). A conductive layer 54 is coated on the insulative covers 48c, as shown in FIG. 13(g). The conductive layer 54 is isolated from the conductive layer 34h by the insulative cover 48c. Thus, the jumper wiring section 52 is formed on the substrate 33.

The thick-film high frequency signal circuit apparatus 29a is provided with a tin-coat lead 50, as shown in FIG. 12. The lead 50 is mounted to the thick-film circuit 28a before housing the thick-film circuit 28a in the shielding case 27. One end of the lead 50 forks into two branches 50a and 50b. The branches 50a and 50b fit to the feedthrough capacitor sections 20a so that the lead 50 is mounted to the thick-film circuit 28a. One branch 50a of the lead 50 is soldered to the conductive layer 53 so that the lead 50 is coupled to the top electrode 43a through the conductive layer 53. The other branch 50b of the lead 50 is soldered to the conductive layer 34c. Another end 50c of the lead 50 protrudes the outside of the shielding case 27 through a hole 31 defined in the sidewall of the shielding case 27. Thus, the end 50c of the lead 50 constitutes a pin terminal 38 for receiving input signals into the thick-film high frequency signal circuit apparatus 29a or outputting signals therefrom.

The elongated portion 34a–e of the bottom electrode 34a is electrically coupled to the shielding case 27 through a conductive wire 45.

Figure 14:
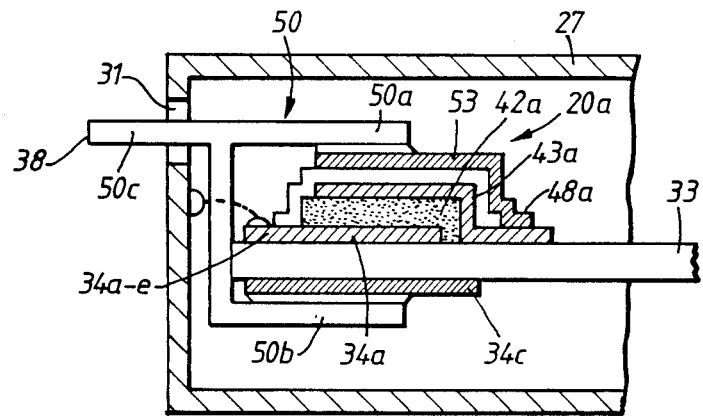
FIG. 14 is a sectional elevation showing a modification of the third embodiment.

Referring now to FIG. 14, a modification of the third embodiment will be briefly described. FIG. 14 is a sectional elevation of the modification of the third embodiment of the thick-film high frequency signal circuit apparatus 29a with a feedthrough capacitor. The thick-film high frequency signal circuit apparatus 29a comprises a thick-film circuit 28a and a shielding case 27 for housing the thick-film circuit 28a. In FIG. 14, a part corresponding to a feedthrough capacitor section 20a is shown in respect to the thick-film circuit 28a. However, the thick-film circuit 28a can be provided with other thick-film components such as the feedthrough capacitor section 20a, the thick-film resistor 35, the regular thick-film capacitor section 40 and the chip transistor 41 in the first embodiment.

The thick-film circuit 28a is constituted on a substrate 33 made of such as the alumina, etc., in similar to the first embodiment. A conductive layer 34a is coated on the substrate 33 according to the conventional screen printing. The conductive layer 34a is made of the silver or the palladium base conductive paste, in similar to the first embodiment.

Then, a dielectric layer 42a is coated on the conductive layer 34a according to the screen printing. The dielectric layer 42a almost covers the conductive layer 34a. But, a part of the conductive layer 34a elongates outside the dielectric layer 42a along the substrate 33. The dielectric layer 42a is made of ceramic paste, in similar to the first embodiment.

Then, a conductive layer 43a is coated on the dielectric layer 42a according to the screen printing. The conductive layer 43a is also made of the silver or the palladium base conductive paste. A part of the conductive layer 43a elongates to the substrate 33 along the side of the dielectric layer 42a. The elongated portion 43a–e of the conductive layer 43a can be used for electrical coupling to some other circuit. The above-mentioned structure constituted on the substrate 33 is fired at 900° C. for one hour so that the feedthrough capacitor section 20a is formed on the substrate 33 simultaneously with the manufacturing process of some other regular thick-film capacitor section such as the regular thick-film capacitor section 40 of the third embodiment.

In the feedthrough capacitor section 20a, the conductive layer 34a constitutes a bottom electrode which will be electrically coupled to the shielding case 27. Thus, the conductive layer 34a will be referred as the bottom electrode 34a of the feedthrough capacitor section 20a, in similar to the first embodiment. The conductive layer 43a constitutes a top electrode which will be electrically coupled to a pin terminal 38 for receiving input signals to the thick-film high frequency signal circuit apparatus 29a or outputting signals therefrom for the shielding case 27. Thus, the conductive layer 43a will be also referred as the top electrode 43a of the feedthrough capacitor section 20a.

Then, an insulative cover 48a is coated to almost cover the feedthrough capacitor section 20a. However, a part of the bottom electrode 34a elongates outside to insulative cover 48a. The elongated portion 34a–e of the electrode 34a can be used for electrical coupling to some other circuit. The elongated portion 43a–e of the bottom electrode 43a also elongates outside the insulative cover 48a.

A conductive layer 53 is coated on the insulative cover 48a. A part of the conductive layer 53 elongates onto the elongated portion 43a–e of the top electrode 43a along the side of the insulative cover 48a. Thus, the conductive layer 53 is coupled to the top electrode 43a..

Further, a conductive layer 34c is coated on the surface of the substrate 33 in correspondence with the feedthrough capacitor section 20a.

The thick-film high frequency signal circuit apparatus 29a is provided with a tin-coat lead 50, as shown in FIG. 14. The lead 50 is mounted to the thick-film circuit 28a before housing the thick-film circuit 28a in the shielding case 27. One end of the lead 50 forks into two branches 50a and 50b. The branches 50a and 50b fit to the feedthrough capacitor sections 20a so that the lead 50 is mounted to the thick-film circuit 28a. One branch 50a of the lead 50 is soldered to the conductive layer 53 so that the lead 50 is coupled to the top electrode 43a through the conductive layer 53. The other branch 50b of the lead 50 is soldered to the conductive layer 34c. Another end 50c of the lead 50 protrudes the outside of the shielding case 27 through a hole 31 defined in the sidewall of the shielding case 27. Thus, the end 50c of the lead 50 constitutes a pin terminal 38 for receiving input signals into the thick-film high frequency signal circuit apparatus 29a or outputting signals therefrom.

The elongated portion 34a-e of the bottom electrode 34a is electrically coupled to the shielding case 27 through a conductive wire 45.

Figure 15:
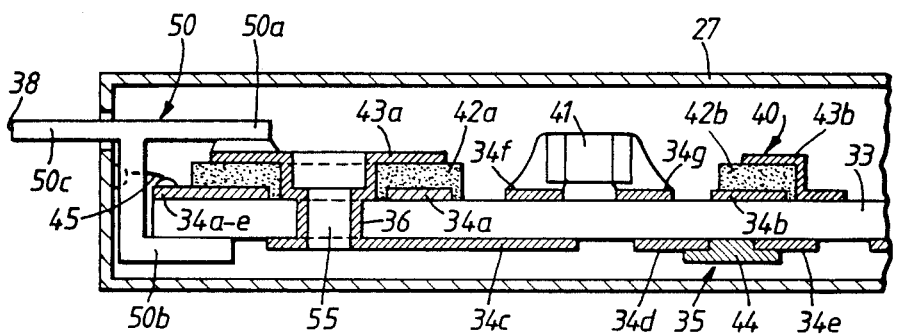
FIG. 15 is a sectional elevation showing a fourth embodiment of the thick-film high frequency signal circuit apparatus according to the present invention.

Referring now to FIG. 15, a fourth embodiment of the thick-film high frequency signal circuit apparatus according to the present invention will be described in detail. In FIG. 15, reference numerals or letters used in FIGS. 5, 9 and 12 (first, second and third embodiments) will be used to designate like or equivalent elements for simplicity of explanation.

FIG. 15 is a sectional elevation of the fourth embodiment of the thick-film high frequency signal circuit apparatus 29a with a feedthrough capacitor section. In FIG. 15, the thick-film high frequency signal circuit apparatus 29a comprises a thick-film circuit 28a and a shielding case 27 for housing the thick-film circuit 28a. The thick-film circuit 28a is constituted on a substrate 33 made of such as the alumina, etc. The thick-film circuit 28a comprises a feedthrough capacitor section 20a, a thick-film resistor 35, a regular thick-film capacitor section 40 and a chip transistor 41.

The substrate 33 is made of ceramic, e.g., alumina. The substrate 33 defines a hole 36. For example, the hole 36 is cut through by the laser beam, in similar to the first embodiment.

Some conductive layers 34a to 34g are coated on the substrate 33 according to the conventional screen printing. These conductive layers 34a to 34g are made of the silver or the palladium base conductive paste, in similar to the first embodiment. The conductive layers 34a and 34c are shaped in a rectangular ring shape around the hole 36 at both surfaces of the substrate 33. The other conductive layers 34b, 34d, 34e, 34f and 34g are shaped to a rectangular shape.

A dielectric layer 42a is coated on the conductive layer 34a according to the screen printing. The dielectric layer 42a on the conductive layer 34a is formed in a rectangular ring shape in correspondence with the shape of the conductive layer 34a. The dielectric layer 42a is made of ceramic paste, in similar to the firs embodiment.

A conductive layer 43a is coated on the dielectric layer 42a according to the screen printing. The conductive layer 43a is also made of the silver or the palladium base conductive paste. The conductive layer 43a is shaped in the rectangular ring shape around the hole 36 and the rectangular shape, in similar to the conductive layers 34a and 34b, respectively. The conductive layer 43a elongates onto the inner wall of the dielectric layer 42b. Thus, the inner wall of the dielectric layer 42a is covered with the conductive layer 43a. Similarly, the conductive layer 34c coated on the other surface of the substrate 33 elongates into the inner wall of the hole 36. Thus, the inner wall of the hole 36 is covered with the conductive layer 34c. These portions elongated into the inner walls of the dielectric layer 42a and the hole 36 of the substrate 33 are electrically couples with each other. Thus, a feedthrough 55 for conducting the conductive layers 43a and 34c together is made.

The descriptions of the regular capacitor section 40, the thick-film resistor 35 and the chip transistor 41 are eliminated hereafter, but they are formed or mounted on the substrate 33, in similar to the above embodiments.

In the feedthrough capacitor section 20a, the conductive layer 34a constitutes a bottom electrode which will be electrically coupled to the shielding case 27. Thus, the conductive layer 34a will be referred as the bottom electrode 34a of the feedthrough capacitor section 20a, in similar to the first embodiment. The conductive layer 43a constitutes a top electrode which will be electrically coupled to a pin terminal 38 for receiving input signals to the thick-film high frequency signal circuit apparatus 29a or outputting signals therefrom for the shielding case 27. Thus, the conductive layer 43a will be also referred as the top electrode 43a of the feedthrough capacitor section 20a.

The thick-film high frequency signal circuit apparatus 29a is provided with a tin-coat lead 50, as shown in FIG. 15. The lead 50 is mounted to the thick-film circuit 28a before housing the thick-film circuit 28a in the shielding case 27. One end of the lead 50 forks into two branches 50a and 50b. The branches 50a and 50b fit to the feedthrough capacitor sections 20a so that the lead 50 is mounted to the thick-film circuit 28a. One branch 50a of the lead 50 is soldered to the top electrode 43a so that the lead 50 is coupled to the conductive layer 34c through the feedthrough 55. The other branch 50b of the lead 50 is attached to the other surface of the substrate 33. Another end 50c of the lead 50 protrudes the outside of the shielding case 27 through a hole 31 defined in the sidewall of the shielding case 27. Thus, the end 50c of the lead 50 constitutes a pin terminal 38 for receiving input signals into the thick-film high frequency signal circuit apparatus 29a or outputting signals therefrom.

The elongated portion 34a-e of the bottom electrode 34a is electrically coupled to the shielding case 27 through a conductive wire 45.

Figure 16:
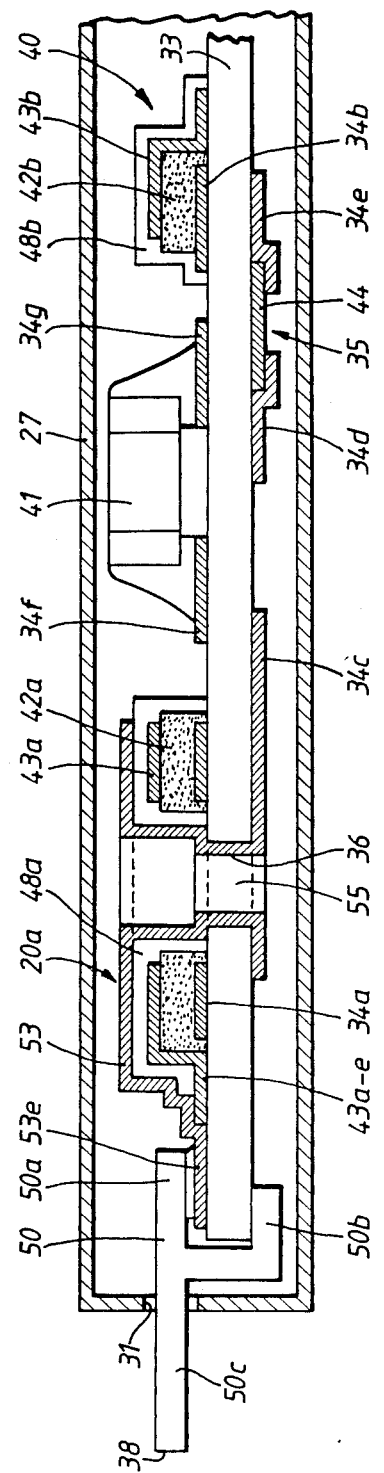
FIG. 16 is a sectional elevation of the fourth embodiment showing a fifth embodiment of the thick-film high frequency signal circuit apparatus according to the present invention.
Figure 17:
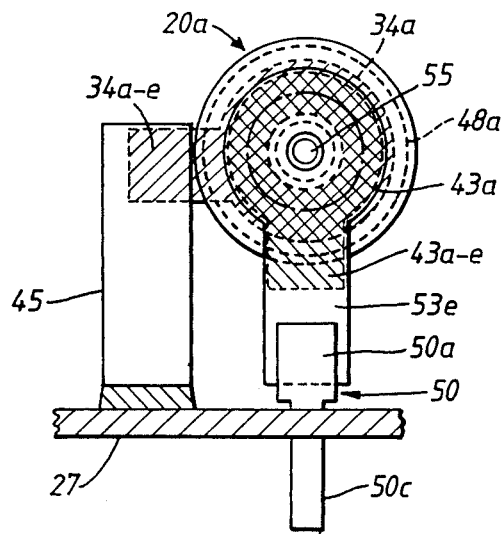
FIG. 17 is a plan view showing a part of the thick-film circuit of FIG. 16.
Figure 18:
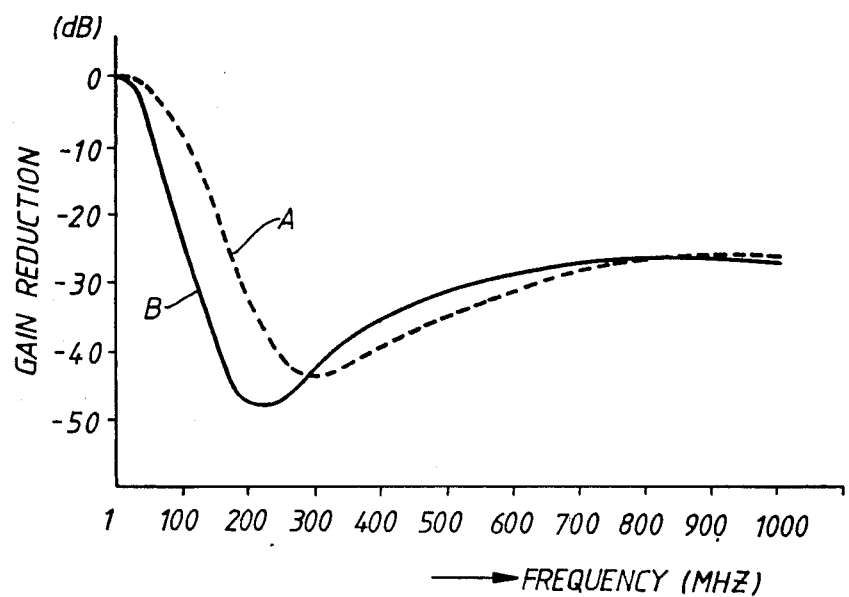
FIG. 18 is a graph comparatively showing high frequency noise reducing characteristics for both the conventional apparatus of FIG. 3 and the fifth embodiment of FIG. 16.

Referring now to FIGS. 16, 17 and 18, a fifth embodiment of the thick-film high frequency signal circuit apparatus according to the present invention will be described in detail. In FIGS. 16, 17 and 18, reference numerals or letters used in FIGS. 5, 9, 12 and 15 (first, second, third and fourth embodiments) will be used to designate like or equivalent elements for simplicity of explanation.

FIG. 16 is a sectional elevation of the fifth embodiment of the thick-film high frequency signal circuit apparatus 29a with a feedthrough capacitor section. In FIG. 16, the thick-film high frequency signal circuit apparatus 29a comprises a thick-film circuit 28a and a shielding case 27 for housing the thick-film circuit 28a. The thick-film circuit 28a is constituted on a substrate 33 made of such as the alumina, etc. The thick-film circuit 28a comprises a feedthrough capacitor section 20a a thick-film resistor 35, a regular thick-film capacitor section 40 and a chip transistor 41.

The substrate 33 is made of ceramic, e.g., alumina. The substrate 33 defines a hole 36. For example, the hole 36 is cut through by the laser beam, in similar to the first and fourth embodiments.

Some conductive layers 34a to 34g are coated on the substrate 33 according to the conventional screen printing. These conductive layers 34a to 34g are made of the silver or the palladium base conductive paste, in similar to the first embodiment. The conductive layers 34a and 34c are shaped in a round ring shape around the hole 36 at both surfaces of the substrate 33. The other conductive layers 34b, 34d, 34e, 34f and 34g are shaped to a rectangular shape.

A dielectric layer 42a is coated on the conductive layer 34a according to the screen printing. The dielectric layer 42a on the conductive layer 34a is formed in a round ring shape in correspondence with the shape of the conductive layer 34a. The dielectric layer 42a is made of ceramic paste, in similar to the first embodiment.

A conductive layer 43a is coated on the dielectric layer 42a according to the screen printing. The conductive layer 43a is also made of the silver or the palladium base conductive paste. The conductive layer 43a is shaped in the round ring shape around the hole 36, in similar to the conductive layer 34a and the dielectric layer 42a. A part of the conductive layer 43a elongates onto the substrate 33 along the side of the dielectric layer 42a. The elongated potion 43a-e of the conductive layer 43a can be used for electrical coupling to some other circuit. The above-mentioned structure constituted on the substrate 33 is fired at 900° C. for one hour so that the feedthrough capacitor section 20a is formed on the substrate 33 simultaneously with the manufacturing process of some other regular thick-film capacitor section such as the regular thick-film capacitor section 40.

In the feedthrough capacitor section 20a, the conductive layer 34a constitutes a bottom electrode which will be electrically coupled to the shielding case 27. Thus, the conductive layer 34a will be referred as the bottom electrode 34a of the feedthrough capacitor section 20a, in similar to the first embodiment. The conductive layer 43a constitutes a top electrode which will be electrically coupled to a pin terminal 38 for receiving input signals to the thick-film high frequency signal circuit apparatus 29a or outputting signals therefrom for the shielding case 27. Thus, the conductive layer 43a will be also referred as the top electrode 43a of the feedthrough capacitor section 20a.

An insulative cover 48a is coated on the feedthrough capacitor section 20a. The insulative cover 48a is formed in the round cylinder shape with a center hole 56 so that the insulative cover 48a the feedthrough capacitor section 20a.

A conductive layer 53 is coated on the insulative cover 48a. The conductive layer 53 elongates onto the inner wall of the dielectric layer 42b. Thus, the inner wall of the center hole 56 of the dielectric layer 42a is covered with the conductive layer 53. Similarly, the conductive layer 34c coated on the other surface of the substrate 33 elongates into the inner wall of the hole 36. Thus, the inner wall of the hole 36 is covered with the conductive layer 34c. These portions elongated into the inner walls of the center hole 56 of the insulative cover 48a and the hole 36 of the substrate 33 are electrically coupled with each other. Thus, a through hole 55 for conducting the conductive layers 53 and 34c together is made.

The conductive layer 53 further elongates onto the substrate 33 along the side of the insulative cover 48a. A halfway of the elongated portion 53e of the conductive layer 53 is coupled to the elongated portion 43a-e of the conductive layer 34a. Thus, the conductive layer 43a is coupled to the conductive layer 34c on the other surface of the substrate 33 through the conductive layer 53 and the through hole 55.

The description of the regular capacitor section 40, the thick-film resistor 35 and the chip transistor 41 are eliminated hereafter, but they are formed or mounted on the substrate 33, in similar to the above embodiments.

The thick-film high frequency signal circuit apparatus 29a is provided with a tin-coat lead 50, as shown in FIG. 16. The lead 50 is mounted to the thick-film circuit 28a before housing the thick-film circuit 28a in the shielding case 27. One end of the lead 50 forks into two branches 50a and 50b. The branches 50a and 50b fit to the feedthrough capacitor sections 20a so that the lead 50 is mounted to the thick-film circuit 28a. One branch 50a of the lead 50 is soldered to the elongated portion 53e of the conductive layer 53. The other branch 50b of the lead 50 is attached to the other surface of the substrate 33. Another end 50c of the lead 50 protrudes the outside of the shielding case 27 through a hole 31 defined in the sidewall of the shielding case 27. Thus, the end 50c of the lead 50 constitutes a pin terminal 38 for receiving input signals into the thick-film high frequency signal circuit apparatus 29a or outputting signals therefrom. The elongated portion 34a-e of the bottom electrode 34a is coupled to the shielding case 27 through a conductive wire 45.

Referring now to FIG. 17, a plan view of a part of the thick-film circuit 28a will be described. In FIG. 17, the feedthrough capacitor sections 20a is formed to the round ring shape, as described above. However, the feedthrough capacitor sections 20a can be formed in the rectangular ring shape. The feedthrough capacitor sections 20a comprises the bottom electrode 34a, the dielectric layer 42a, the top electrode 43a and the insulative cover 48a. The bottom electrode 34a, the top electrode 43a and the conductive layer 53 are provided with the elongated portions 34a-e, 43a-e and 53e. The elongated portion 34a-e of the bottom electrode 34a is electrically coupled to the shielding case 27 through a conductive layer 45a coated on the substrate 33. The elongated portions 43a-e and 53e of the top electrode and the conductive layer 53 are coupled together as described above. Then, the end 50a of the lead 50 is soldered to the elongated portion 53e of the conductive layer 53, as described above.

Figure 3:
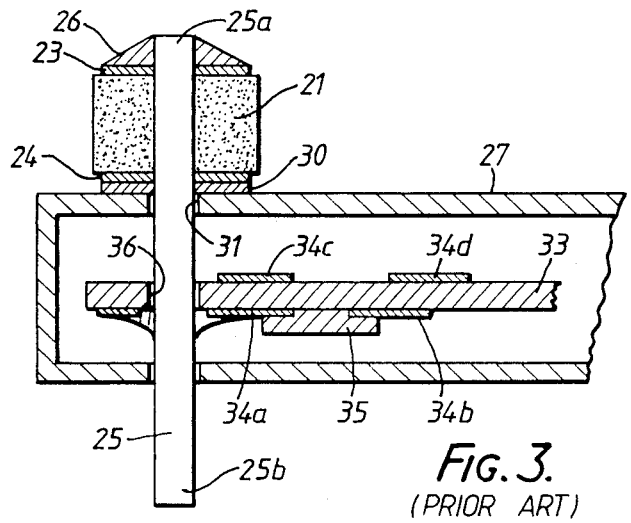
FIG. 3 is a sectional elevation showing a conventional thick-film high frequency signal circuit apparatus.

Referring now to FIG. 18, the high frequency noise reducing characteristics of such thick-film high frequency signal circuit apparatus will be described. FIG. 18 is a graph showing the high frequency noise reducing characteristics for both the conventional apparatus, as shown in FIG. 3, and the fifth embodiment of the apparatus according to the present invention, as shown in FIG. 16. In FIG. 18, Graph A is the characteristics of the conventional apparatus. Graph B is the characteristics of the fifth embodiment of the apparatus according to the present invention. As shown in FIG. 18, Graph B has the improved noise reduction characteristics in the lower frequency region in compared to the characteristics of Graph A. Graph B also has the noise reduction characteristics comparative to the characteristics of Graph A in the higher frequency region.

As described above, the present invention can provide an extremely preferable thick-film high frequency signal circuit apparatus with an improved feedthrough capacitor.

While there has been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A thick-film high frequency signal circuit apparatus with a feedthrough capacitor, comprising:
   a thick-film circuit in which a high frequency signal circuit is constituted on a substrate in a thick-film configuration;
   a shielding case for housing the thick-film circuit therein;
   a feedthrough capacitor constituted on one surface of the substrate in the thick-film configuration; and
   means for transmitting signals between the thick-film circuit and a circuit outside the shielding case, the signal transmitting means having a first end coupled to the thick-film circuit through the feedthrough capacitor and a second end protruding outside the shielding case through a hole defined therein.

2. The apparatus of claim 1 wherein the thick-film circuit has a thick-film capacitor formed on the substrate in simultaneous with the feedthrough capacitor.

3. The apparatus of claim 1 wherein the feedthrough capacitor has a bottom electrode layer coated on the substrate, a dielectric layer coated on the bottom electrode layer and a top electrode layer coated on the dielectric layer.

4. The apparatus of claim 3 wherein the feedthrough capacitor further has an insulative layer covered on the top electrode layer.

5. The apparatus of claim 4 wherein the feedthrough capacitor further has a second conductive layer coated on the insulative layer.

6. The apparatus of claim 5 wherein the second conductive layer has a portion filled in a hole defined in the insulative layer for conducting the second conductive layer to the top electrode.

7. The apparatus of claim 6 wherein the signal transmitting means has the first end which is parallelly forked into two branches for holding the feedthrough capacitor and the substrate therebetween.

8. The apparatus of claim 7 wherein one branch of the first end is soldered to the first conductive layer coated on the top electrode layer of the feedthrough capacitor.

9. The apparatus of claim 8 wherein the other branch of the first end is soldered to the second conductive layer coated on the other surface of the substrate.

10. The apparatus of claim 5 wherein each of the second conductive layer and the top electrode layer has a portion elongated onto the substrate and these elongated portions are coupled to each other.

11. The apparatus of claim 10 wherein the thick-film circuit further has a feedthrough means which penetrates through both the feedthrough capacitor and the substrates for conducting the top electrode layer of the feedthrough capacitor with the first conductive layer coated on the other surface of the substrate through the second conductive layer.

12. The apparatus of claim 3 wherein the thick-film circuit further has a conductive layer on another surface of the substrate in opposite to the feedthrough capacitor and a feedthrough means which penetrates through both the feedthrough capacitor and the substrate for conducting the top electrode layer of the feedthrough capacitor with the conductive layer.

13. The apparatus of claim 1 wherein the signal transmitting means penetrates both the feedthrough capacitor and the substrate and the first end of the signal transmitting means is electrically coupled to the top electrode layer.

14. The apparatus of claim 13 wherein the thick-film circuit further has a conductive layer on another surface of the substrate in opposite to the feedthrough capacitor and the signal transmitting means is coupled to the conductive layer.

15. The apparatus of claim 14 wherein the thick-film circuit further has a feedthrough means which penetrates through both the feedthrough capacitor and the substrate for conducting the top electrode layer of the feedthrough capacitor with the conductive layer coated on the other surface of the substrate.

16. The apparatus of claim 1 wherein the signal transmitting means has the first end which is parallelly forked into two branches for holding the thick-film circuit.

17. The apparatus of claim 16 wherein these two branches of the first end hold the feedthrough capacitor and the substrate therebetween.

18. The apparatus of claim 17 wherein one branch of the first end is soldered to the top electrode layer of the feedthrough capacitor.

19. The apparatus of claim 18 wherein the thick-film circuit further has a conductive layer on another surface of the substrate in opposite to the feedthrough capacitor and the other branch of the first end is soldered to the conductive layer.

20. The apparatus of claim 17 wherein the feedthrough capacitor defines a hole and one branch of the first end is coupled to the bottom electrode layer of the feedthrough capacitor through a conductive bonding agent filled in the hole of the feedthrough capacitor.

21. The apparatus of claim 16 wherein these two branches of the first end hold the substrate therebetween.

22. The apparatus of claim 21 wherein the bottom electrode layer of the feedthrough capacitor has a portion elongated onto the substrate and one branch of the first end is soldered to the elongated portion.

23. The apparatus of claim 21 wherein the top electrode layer of the feedthrough capacitor has a portion elongated onto the substrate and on branch of the first and is soldered to the elongated portion.

24. The apparatus of claim 21 wherein the thick-film circuit has an insulative layer covering the feedthrough capacitor and a conductive layer coated on the insulative layer and the one branch of the first end is soldered to a portion elongated from the conductive layer onto the substrate.

* * * * *